(12) United States Patent
Jousseaume

(10) Patent No.: US 8,524,332 B2
(45) Date of Patent: Sep. 3, 2013

(54) PROCESS FOR PREPARING THIN LAYERS OF NANOPOROUS DIELECTRIC MATERIALS

(75) Inventor: Vincent Jousseaume, Le Sappey en Chartreuse (FR)

(73) Assignee: Commissariat a l'Energie Atomique, Paris (FR)

( * ) Notice: Subject to any disclaimer, the term of this patent is extended or adjusted under 35 U.S.C. 154(b) by 773 days.

(21) Appl. No.: 12/176,119

(22) Filed: Jul. 18, 2008

(65) Prior Publication Data
US 2009/0155535 A1 Jun. 18, 2009

(30) Foreign Application Priority Data
Jul. 20, 2007 (FR) .................................... 07 56651

(51) Int. Cl.
*H05H 1/24* (2006.01)
*B05D 5/00* (2006.01)
*B05D 3/02* (2006.01)
*B05D 5/06* (2006.01)
*H05B 6/02* (2006.01)
*H05B 6/46* (2006.01)

(52) U.S. Cl.
USPC ............ 427/579; 427/243; 427/543; 427/387

(58) Field of Classification Search
USPC ................. 427/243, 543, 387; 428/119, 158, 428/469; 424/423; 438/518, 526, 530, 565, 438/965, 409, 763, 778, 780, 781, 622, 623, 438/624; 252/571, 573, 580; 216/41, 55, 216/53, 83, 67; 257/E21.271, E21.273, E21.259; 264/425, 264/216, 272, 310, 41, 83
See application file for complete search history.

(56) References Cited

U.S. PATENT DOCUMENTS

| | | | |
|---|---|---|---|
| 6,905,909 B2 * | 6/2005 | Cui et al. ....................... | 438/105 |
| 6,963,137 B2 | 11/2005 | Giles | |
| 7,011,890 B2 * | 3/2006 | Nguyen et al. ................. | 428/447 |
| 2003/0124870 A1 | 7/2003 | Macneil et al. | |
| 2004/0156987 A1 | 8/2004 | Yim et al. | |
| 2004/0175581 A1 * | 9/2004 | Nguyen et al. ................. | 428/447 |
| 2005/0106376 A1 * | 5/2005 | Leung et al. ................ | 428/304.4 |
| 2005/0156285 A1 | 7/2005 | Gates et al. | |
| 2006/0134906 A1 * | 6/2006 | Lu et al. ........................ | 438/619 |
| 2007/0161256 A1 | 7/2007 | Gates et al. | |

FOREIGN PATENT DOCUMENTS

| | | |
|---|---|---|
| WO | WO 03/044843 | 5/2003 |
| WO | WO 2005/098085 | 10/2005 |
| WO | WO 2006/079979 | 8/2006 |

OTHER PUBLICATIONS

French Search Report prepared in corresponding French Patent Application No. 07 56651.
Chapelon, L.L., et al. "Characterization and integration of a CVD porous SiOCH (k<2.5) with enhanced mechanical properties for 65 nm CMOS interconnects and below", Microelectronic Engineering, 2004, p. 1-7, vol. 76.
Merlet, Samuel, et al., "Preparation and characterization of nanocellular poly(phenylquinoxaline) foams. A new approach to nanoporous high-performance polymers", Macromolecules, 2007, p. 2070-2078, vol. 40.
Yokoyama, Hideaki, et al., "Nanocellular structures in block copolymers with $CO_2$-philic blocks using $CO_2$ as a blowing agent: Crossover from Micro-to Nanocellular structures with depressurization temperature", Macromolecules, 2005, p. 10516-10522, vol. 38.

* cited by examiner

*Primary Examiner* — Kelly M Gambetta
(74) *Attorney, Agent, or Firm* — Brinks Hofer Gilson & Lione

(57) ABSTRACT

A process for preparing a thin layer of a nanoporous dielectric material with homogeneous porosity is provided. The method includes depositing a first thin layer of an oxygen-free material onto a substrate. A second thin layer of a second material is deposited onto the first layer. The first layer and second layer assembly are treated under conditions so that a gas is generated in the first layer by foaming, leading to the creation of nanopores in the first layer. The second thin layer will not form a gas during this treatment and will have a sufficient density to limit or prevent the spread and/or diffusion of the gas generated in the first layer. The second thin layer may be removed.

15 Claims, No Drawings

PROCESS FOR PREPARING THIN LAYERS OF NANOPOROUS DIELECTRIC MATERIALS

This application also claims the benefit under 35 U.S.C. §119 of French Patent Application No. 07 56651 filed on Jul. 20, 2007, the entire contents of which is hereby incorporated herein by reference.

TECHNICAL FIELD

This invention relates to a process for preparing thin layers of nanoporous dielectric materials implementing in particular a chemical vapor deposition technique (CVD) and more specifically a plasma-assisted or plasma-enhanced chemical vapor deposition technique (PACVD or PECVD).

The technical field of the invention can be defined in general as the preparation of thin layers of nanoporous dielectric materials and in particular nanoporous thin layers of materials with a very low dielectric constant ("Ultra Low K" or "ULK").

The production of thin-layer nanoporous dielectrics is indeed a very active research field, in particular in microelectronics applications, for example, as low permittivity dielectrics or insulating membranes.

The possibility of producing these porous dielectrics by a chemical vapor deposition technique ("CVD") and in particular a plasma-enhanced chemical vapor deposition technique ("PECVD") using equipment already available allows for greater ease of integration in production lines.

One of the possible applications for these porous dielectrics is the production of "Ultra low K" (ULK) materials.

The reduction of the critical dimensions of integrated circuits has gradually imposed the use of these materials as insulating dielectrics in metal interconnections. They are generally nanoporous materials comprised of Si, O, C and H, and have a dielectric constant below 2.7 and ideally below 2.3.

The approach commonly used to produce this type of material by CVD requires the deposition of a material including two phases, namely a phase containing Si, O, C or H, which constitutes the structure of the material, and an organic, so-called porogenic phase (C, H, O), which will serve as a sacrificial phase [1]. The sacrificial phase is decomposed in a suitable treatment, leading to the formation of a nanoporous thin layer as long as the porosity caused by the decomposition of the porogen is greater than the collapse of the structure, backbone, observed in the treatment.

More specifically, document [1] describes a process for depositing films with a low dielectric constant by PACVD or PECVD, which include Si, O and C, by reacting one or more linear oxygen-free organosilicon compounds; one or more oxygen-free hydrocarbon compounds having a ring and one or two carbon-carbon double bonds in the ring; and one or more oxidizing gases to form the structure, backbone, of the film.

After the deposition, the film is subjected to a thermal annealing or plasma-assisted treatment, or an electron beam treatment, which removes at least some of the organic groups from the film, such as the cyclic groups, in order to thus create, voids, holes, or pores in the film.

The oxygen-free organosilicon compounds are in particular silanes, such as trimethylsilane, and an oxygen-free hydrocarbon compound is, for example, alpha-terpinene.

It is possible, optionally, also to introduce organosilicon compounds containing oxygen into the deposition chamber.

Document [2] describes the production of a thin-layer nanoporous dielectric material deposited by PECVD, which has a non-homogeneous porosity over the depth in the layer.

More specifically, document [2] describes the preparation of a layer with a low dielectric constant formed on a substrate, which layer consists of:
- a base zone, adjacent to the substrate in which pores are distributed, with most of the pores having diameters in the range of 1 to 10 nm;
- an atomically smooth surface zone;
- an intermediate zone in which the diameter of the pores is smaller than 2 nm.

Such a layer is deposited by reacting tetramethylsilane and oxygen in a neutral gas at a substrate temperature of 30° C.

The deposited film is then treated by a hydrogen plasma at 400° C., which creates a crust with a higher k value, which is then optionally removed by etching ("Etch back").

The deposition process of document [2] does not require the production of a biphasic material, but the existence of a porosity gradient (also with a composition gradient) in the porous layer produced causes a variation in the electrical properties of the film in the direction of the thickness, which can present problems if this material is to be used in an integrated circuit. Moreover, if metal interconnections are to be produced using a damascene approach, it is necessary to etch trenches or contact holes in the porous dielectric. The presence of this non-homogeneous porosity greatly complicates control of the etching process applied on it, and which must be adapted according to the depth of etching.

Document WO-A-03/044843 [6] describes the preparation of "low K" dielectric layers. In this process, the following steps are carried out:
- a dielectric layer is deposited on a substrate, which dielectric layer includes Si, C and oxygen;
- the surface of the dielectric layer is exposed to an oxygen, nitrogen or hydrogen plasma in order to form a semi-permeable skin on or of the surface of the layer;
- the layer is annealed so as to make at least a portion of the layer porous; or
- a dielectric layer is deposited on a substrate, which dielectric layer includes Si, C and oxygen;
- a surface zone of the layer is at least partially annealed; and
- the layer is annealed so as to make the mass, bulk, of the layer porous; or
- a dielectric layer is deposited on a substrate, which dielectric layer includes Si, C and oxygen;
- a semi-permeable layer is formed by, or deposited on, the surface of the layer; and
- the layer is hardened, thereby rendering at least a portion of the layer porous.

In this document, the gas created essentially by the release of OH and water inside the film is used to create a porous structure inside of it.

By treating the exposed surface of the film so as to form a semi-permeable skin on the surface of the film and/or by partially annealing the surface layer, the gas release is reduced and/or controlled so that when the layer is annealed, the material is fixed with the creation of a more or less porous structure due to the release of gas.

In the examples ([0145]), a thick layer of 5000 Å of silicon dioxide containing methyls was deposited from tetramethyl silane and oxygen in nitrogen as a vector gas.

Document US-A1-2003/124870 [7] describes a process similar to that of document [6].

Document WO-A-2006/079979 [8] describes a process for producing a semiconductor device including steps consisting of applying a non-annealed or only partially annealed layer of dielectric material on a substrate, which layer comprises an exposed surface; and of annealing the dielectric material.

The step of annealing the dielectric material consists of a first partial annealing in order to form a dense layer near the exposed surface or at the level thereof, which dense layer acts as a protective layer for at least one subsequent step of production of the dielectric material, and of a subsequent annealing in order to harden the material.

The material can include a SiCO:H-type material, which can be applied by a CVD technique.

On page 6, lines 31 to 34, reference is made to document [6] in order to indicate that pores can be created in the low-k layer in a manner similar to that of said document.

As clearly shown in FIGS. 1A and 1B of document [6], the physical mechanism implemented in the process of this document, but also in the processes of documents [7] and [8] involves the condensation of silanol in order to form water, then the foaming with water.

Therefore, it is not possible with the process of documents [6], [7] and [8], or with that of documents [1] and [2] to obtain porosity in materials not comprising oxygen, such as, for example SiCH, SICN, SiCNH or SiCF.

Therefore, in view of the above, there is a need for a process for preparing a thin layer of a nanoporous material, in particular by the chemical vapor deposition technique ("CVD") and in particular the plasma-assisted or plasma-enhanced chemical vapor deposition technique ("PECVD" or "PACVD"), which is simple, reliable, easy to implement, and which makes it possible to deposit thin layers having a homogeneous porosity, i.e. a porosity uniformly distributed throughout the layer and over the entire thickness thereof, the size of the pores being moreover substantially the same throughout the layer.

There is also a need for a process that requires a limited number of precursors to prepare the layer, preferably only one, and that can be implemented in existing equipment, for example existing CVD equipment.

There is more specifically a need for a process that makes it possible to obtain porosity in materials not including oxygen, such as SiCH, SiCN, SiCNH or SiCF in which it has not yet been possible to obtain porosity.

DETAILED DESCRIPTION OF THE INVENTION

The objective of this invention is to provide a method for preparing a thin layer of a nanoporous material that satisfies, inter alia, the requirements indicated above.

The objective of this invention is also to provide such a process that does not have the disadvantages, defects, limitations and disadvantages of the processes of the prior art, as represented in particular in documents [1], [2], [6], [7] and [8] cited above, which solve the problems of the prior art, and which make it possible in particular to prepare a thin layer of a nanoporous material with a homogeneous porosity, in materials not containing oxygen.

This objective and others are achieved, according to the invention, by a process for preparing a thin layer of a nanoporous dielectric material with homogeneous porosity in which the following successive steps are performed:

a first thin layer of a first oxygen-free material, including Si, C and optionally one or more other atoms chosen from H, N and F is deposited on a substrate, under conditions so that said first thin layer has a composition making it possible to generate a gas in a subsequent foaming treatment;

on the first layer, a second thin layer so-called crust of a second material including Si and at least one other atom chosen from O, C, N, F and H is deposited under conditions so that said second thin layer has a composition that does not make it possible to generate a gas in the subsequent foaming step, and a sufficient density to limit or prevent the diffusion, spread, of the gas generated in the first layer during the subsequent foaming treatment;

the first layer and second layer assembly is treated under conditions so that a gas is generated in the first layer in order to enable the foaming thereof and the creation of nanopores therein;

the second thin layer is optionally removed.

The material of the first thin layer is without oxygen, does not contain oxygen, or is oxygen-free.

The process according to the invention includes a specific series of specific steps that are neither described nor suggested in the prior art.

It should be specified that in the present invention, the term "thin layer" generally means, in the case of both the first thin layer and the second thin layer, a layer with a thickness of 5 to 1500 nm, preferably 10 to 1000 nm, and more preferably 80 to 600 nm.

The term "nanoporosity", or "nanopores", generally means that the pores have a dimension, generally defined by their average diameter, smaller than 10 nm, and preferably from 0.5 to 4 nm.

The term "homogeneous porosity" generally means that this porosity is uniformly distributed throughout the nanoporous layer and in particular over the thickness thereof, and, moreover, that the average diameter of the pores is substantially the same throughout the thin layer.

It is generally important to define the term "foaming", which is the generation of a gas in a material by heat treatment, UV, plasma, etc., leading to the creation of nanoholes, nanovoids traditionally called "nanocells" in the material.

The process according to the invention can be defined as a process for obtaining a thin layer of porous material with homogeneous porosity on a substrate, which process includes:

the deposition of a layer, preferably a dielectric layer that may or may not contain organic inclusions on a substrate;

the deposition of a layer above the aforementioned layer, which layer acts as a "crust", of which the thickness and composition are controlled;

the treatment of the stack formed by the dielectric layer and the crust, so as to create porosity in the first dielectric layer;

optionally, the removal of the crust by any suitable process such as chemical or plasma etching, or chemical mechanical polishing (CMP).

The process according to the invention is based on a principle fundamentally different from that of the processes of the invention of the prior art in which the porosity is generated by simple decomposition, degradation, of the layer initially deposited, or more specifically of a sacrificial organic phase of said layer, removal of functions, organic groups contained in said layer, and reorganization, restructuration of said layer without foaming.

The procedure of the prior art produces insufficient porosity and sinking or collapsing of the layer.

In the process according to the invention, the pores are created by the generation of a gas in the first layer deposited, in other words by foaming, and not, for example, by simple degradation, decomposition, or removal of a sacrificial phase. This generation of gas, foaming, is contained, limited or even prevented by the so-called crust layer deposited on the first thin layer, leading to a better distribution of porosity than in the processes without foaming, using a simple "porogenic" approach, as well as a significant increase in the porosity ratio in the thin layer initially deposited.

Moreover, the process of the invention also uses a mechanism totally different from that on which the processes of documents [6], [7] and [8] are based, which involves the condensation of silanol in order to form water, then foaming with water. This means that it is not possible with the processes of these documents to prepare nanoporous oxygen-free material layers.

The process according to the invention therefore meets all of the needs mentioned above, overcomes the disadvantages, drawbacks of the prior art and solves the problems raised by these processes.

The process according to the invention makes it possible to prepare, for the first time, nanoporous thin layers with a high and homogeneous porosity, without collapse, in oxygen-free materials.

The process according to the invention is simple, reliable and easy to implement and can be carried out in existing, conventional equipment without requiring adaptation thereof.

As mentioned above, the approach adopted in the process of the invention is entirely different, totally departs, from the approach used until now to create nanoporosity in dielectric layers, and in particular in oxygen-free dielectric layers, and in fact challenges and overcomes widespread beliefs, prejudices, in this field.

Indeed, in the case of the process described in document [2], the man skilled in the art of microelectronics has not completely understood the physical phenomenon involved in the creation of porosity. The various articles attempting to describe this mechanism discuss restructuring of the SiO structure during the plasma treatment by means of cross-linking of silanols [3]. One of the surprising hypotheses at the basis of this invention is that a foaming of a gas generated in the post-deposition treatment is the source of the creation of the porosity in this type of approach. Therefore, according to the invention, advantage is taken of this foaming phenomenon, and the invention attempts to cause it and control it in particular owing to the "crust" layer.

This hypothesis challenges certain assumptions ("a priori") of the person skilled in the art in the field of foams, in which it is well known that this foaming technique is not applicable for nanoporous thin layers, namely for average pore diameters smaller than 10 nm [4]. In addition, the formation of these nanocellular materials (this is the term used in foaming) is generally based on a complex process including saturation of the polymer to be foamed by an inert gas in a high-pressure chamber, for example supercritical $CO_2$ [5]. Finally, foaming has been described for polymers, usually organic, but not for dielectric materials deposited by a CVD technique.

In other words, the approach according to the invention makes it possible to compensate for the collapse traditionally observed in a so-called "porogenic" approach without foaming and to significantly increase the porosity in layers with respect to the processes of the prior art.

Moreover, in an entirely surprising manner, the process according to the invention makes it possible to obtain a porosity in oxygen-free materials, other than SiOCH, in which a porosity had never before been obtained, such as, for example SiCH, SICN, SiCNH, or SiCF. For the first time, owing to the process according to the invention, porosity is obtained in these materials.

If we consider documents [6], [7] and [8] as already indicated above, the mechanism leading to porosity in the processes of these documents is fundamentally based on the condensation of silanol in order to form water, then foaming with the water.

In the processes of documents [6], [7] and [8], the presence of oxygen is therefore, mandatory, necessary, in the material of the layer in order to then obtain porosity. It is therefore entirely surprising that, according to the invention, it is possible to obtain porosity with oxygen-free materials, for example, containing only Si, C and optionally one or more of H, N and F.

This is a second belief, prejudice, which the process according to the invention challenges and overcomes.

The process according to the invention makes it possible to obtain porosity in materials that had never before been made porous.

The process according to the invention will now be described more precisely in the following detailed description.

In the first step of the process according to the invention, a thin layer of a first material is deposited. This material includes, contains (preferably consists of) Si, C and optionally includes (preferably consists of) one or more of H, N and F. This material can be, for example SiCH, SiCN, SiCNH, or SiCF. According to the invention, this material does not contain oxygen, is oxygen-free.

Throughout this description, it should be noted that these symbols (SiCH, etc.) commonly used in this technical field do not indicate the atomic composition of these compounds, but rather that these compounds contain certain atoms. Thus, SiCH is simply a compound containing Si, C and H; SiCF is a compound containing Si, C and F, but these compounds do not contain, respectively, one atom of Si, of C and of H or one atom of Si, of C and of F.

Since the objective of the process is to prepare a dielectric layer as the final product, this first layer is generally a dielectric layer.

The dielectric property of the first thin layer deposited is reinforced by the process of the invention.

By dielectric material, we generally mean a material of which the dielectric constant k is <6. Preferably, this material is a material with a very low dielectric constant "ULK", namely of which the dielectric constant k is below 3.

It is generally not necessary for the material of the first thin layer initially deposited to have such a low dielectric constant at this stage in the process.

Such a dielectric constant "ULK" may be obtained as a result of the process by reinforcement of the dielectric property due to the process.

The material of the first layer can also be a biphasic material with a phase containing (preferably consisting of) Si, C, H and a porogenic organic phase containing (preferably consisting of) C and H, as in the case of a porogenic approach of the prior art (represented, for example in document [1]), but the deposition must of course be performed under conditions so that the first thin layer has a composition enabling a gas to be generated, to cause foaming thereof, in a subsequent foaming step.

By "conditions so that the first thin layer has a composition enabling a gas to be generated in a subsequent foaming step" or more simply "conditions enabling foaming", we generally mean conditions ensuring the presence in the first layer of organic groups capable of generating, in the subsequent foaming treatment, gases in the first thin layer deposited.

These organic groups are generally chosen from hydrocarbon groups such as alkyl groups having 1 to 10 C, such as methyl, ethyl, propyl, butyl groups, and so on.

According to the type of organic groups, different gases will be generated in the first thin layer deposited. Thus, the methyl group will lead to the formation of methane $CH_4$, and the ethyl group will lead to the formation of ethane $C_2H_4$.

The person skilled in the art will known how to adapt the deposition conditions so that these organic groups will be present in the first layer at a concentration making it possible to generate the amount of gas suitable to produce the desired porosity in the foaming step.

In order for the organic groups to be present, the deposition of the first layer must therefore, for example, be performed at low temperature, namely generally from 20° C. to 250° C., generally in a non-oxidizing atmosphere depending on the material to be deposited.

A non-oxidizing atmosphere will lead, for example to SiCH.

The deposition process used to deposit the first thin layer of dielectric material is generally chosen from the processes for depositing thin layers from a precursor solution.

This process can thus be chosen from the chemical vapor deposition CVD processes, plasma-assisted or plasma-enhanced chemical vapor deposition PECVD or PACVD processes, or the spin coating process.

The preferred process is the CVD process or the PECVD or PACVD process, which uses one or more precursors chosen, for example, from oxygen-free organosilicon compounds, oxygen-free hydrocarbon compounds, ammonia, and mixtures thereof. The PECVD deposition is preferably performed under the low-temperature conditions specified above.

Among the oxygen-free organosilicon compounds, the following compounds can be cited:

| | |
|---|---|
| methylsilane | $CH_3—SiH_3$ |
| dimethylsilane | $(CH_3)_2—SiH_2$ |
| trimethylsilane | $(CH_3)_3—SiH$ |
| tetramethylsilane | $(CH_3)_4—Si$ |
| ethylsilane | $CH_3—CH_2—SiH_3$ |
| disilanomethane | $SiH_3—CH_2—SiH_3$ |
| bis(methylsilano)methane | $CH_3—SiH_2—CH_2—SiH_2—CH_3$ |
| 1,2-disilanoethane | $SiH_3—CH_2CH_2—SiH_3$ |
| 1,2-bis(methylsilano)ethane | $CH_3—SiH_2—CH_2—CH_2—SiH_2—CH_3$ |
| 2,2-disilanopropane | $SiH_3—C(CH_3)_2—SiH_3$ |
| diethylsilane | $(C_2H_5)_2—SiH_2$ |
| propylsilane | $C_3H_7—SiH_3$ |
| vinylmethylsilane | $(CH_2=CH)—SiH_2—CH_3$ |
| 1,1,2,2-tetramethyldisilane | $(CH_3)_2—SiH—SiH—(CH_3)_2$ |
| hexamethyldisilane | $(CH_3)_3—Si—Si—(CH_3)_3$ |
| 1,1,2,2,3,3-hexamethyltrisilane | $(CH_3)_2—SiH—Si(CH_3)_2—SiH—(CH_3)_2$ |
| 1,1,2,3,3-pentamethyltrisilane | $(CH_3)_2—SiH—SiH(CH_3)—SiH—(CH_3)_2$ |
| 1,3-bis(methylsilano)propane | $CH_3—SiH_2—(CH_2)_3—SiH_2—CH_3$ |
| 1,2-bis(dimethylsilano)ethane and | $(CH_3)_2—SiH—(CH_2)_2—SiH—(CH_3)_2$ |
| 1,3-bis(dimethylsilano)propane bis(trimethylsilymethane) | $(CH_3)_2—Si—(CH_2)_3—Si—(CH_3)_2$ | as well as diphenylmethylsilane, dimethylphenylsilane and vinyltrimethylsilane.

Among the oxygen-free hydrocarbon compounds, it is possible to cite in particular α-terpinene (ATP), toluene and methane.

It is also possible in particular to use a mixture of an oxygen-free organosilicon compound precursor, such as a silane described above, with an oxygen-free hydrocarbon compound precursor, for example methane $CH_4$.

Since the material of the first layer, does not contain oxygen, is oxygen free, an oxidizing gas will not be used; this is the case, for example, in the deposition of a layer of SiC.

Optionally, one or more inert vector gases are introduced into the deposition chamber in addition to the precursors. The inert gas(es) is (are) generally chosen from helium, nitrogen and mixtures thereof.

If different precursors are used, a mixture of precursors, for example a hydrocarbon compound precursor and an organosilicon compound precursor, the ratio between these compounds is generally between 10:1 and 1:10.

The first layer according to the invention can thus be deposited from trimethylsilane, toluene and helium or from triphenylmethylsilane and helium.

In every case, it is important that the deposition by CVD or PECVD is done at low temperature, for example from 20 to 250° C. so that the deposited layer has a composition so that it comprises organic groups such as hydrocarbon groups, and preferably so that this layer is rich in organic groups that ensure the generation of gas and the foaming in the subsequent foaming step.

In the second step of the process of the invention, on the first thin dielectric material layer, a second thin layer called a "crust" layer of a material including (preferably consisting of) Si and at least one other atom chosen from H, O, C, N and F is deposited.

It can be, for example $SiO_2$ or SiCNH.

This deposition is performed under conditions so that this second thin layer has a composition that does not enable a gas to be generated in the subsequent foaming step and so that the density of the second layer is sufficient to limit or even prevent the spread, diffusion, of the gas generated in the first layer during the subsequent foaming treatment.

In other words, the conditions for deposition of this second layer are chosen in order to prevent this layer from foaming during the subsequent treatment step intended to produce the foam.

In addition, the deposition of the second layer must generally be performed under conditions that barely or do not decompose the first deposited layer, for example, of SiCH.

Therefore, this deposition is generally performed under the low-temperature conditions already specified above for the deposition of the first layer.

The composition of this layer (which can therefore be called a "crust"), as well as the thickness thereof, will generally be chosen so as to be compatible with the treatment used in the subsequent foaming step.

This layer must be dense enough to make it difficult or even impossible for the gas generated in the dielectric layer to spread, diffuse, during the foaming step.

The thickness of this second layer will therefore generally be, as already specified above, in particular from 5 to 1000 nm, preferably from 10 to 100 nm, and its density will generally be from 1.3 to 3.

The second layer or "crust" can be deposited by a process similar to that used for the deposition of the first layer, but it is preferably deposited by a CVD process, in particular PECVD or PACVD using one or more precursor(s), one or more optional oxidizing gas(es) and one or more optional inert gas(es).

The precursors can be chosen, for example, from the oxygen-free organosilicon compounds, oxygen-free hydrocarbon compounds, ammonia, and mixtures thereof. But for the deposition of this second layer, they can also be chosen from compounds with oxygen and in particular from organosilicon compounds with oxygen, alone or in a mixture with one or more precursors already cited.

The oxygen-free precursors, inert gases used in such a process have already been described in detail above.

The oxidizing gas(es) can be chosen from oxygen, water, air, oxygen-enriched air, $N_2O$, and mixtures thereof.

Among the organosilicon compounds with oxygen, it is possible to cite the following compounds:

| | |
|---|---|
| tetraethyl-orthosilicate (TEOS) | |
| 1,3,5,7-tetramethylcyclotetrasiloxane (TMCTS) | —(—SiHCH$_3$—O—)$_4$-(cyclic) |
| octmethylcyclotetrasiloxane (OMCTS) | —(—Si(CH$_3$)$_2$—O—)$_4$-(cyclic) |
| 1,3,5,7,9-pentamethylcyclopentasiloxane | —(—SiHCH$_3$—O—O)$_5$-(cyclic) |
| 1,3,5,7-tetrasilano-2,6-dioxy-4,8-dimethylene | —(—SiH$_2$—CH$_2$—SiH$_2$—O—)$_2$-(cyclic) |
| hexamethylcyclotrisiloxane | —(—Si(CH$_3$)$_2$—O—)$_3$-(cyclic) |
| diethoxymethylsilane (DEMS) | CH$_3$—SiH—(O—CH$_2$—CH$_3$)$_2$ |
| 1,3-dimethyldisiloxane | CH$_3$—SiH$_2$—O—SiH$_2$—CH$_3$ |
| 1,1,3,3-tetramethyldisiloxane | (CH$_3$)$_2$—SiH—O—SiH—(CH$_3$)$_2$ |
| hexamethyldisiloxane (HMDS) | (CH$_3$)$_3$—Si—O—Si—(CH$_3$)$_3$ |
| 1,3-bis(silanomethylene)disiloxane | (SiH$_3$)—CH$_2$—(SiH$_2$)$_2$ |
| bis(1-methyldisiloxanyl)methane | (CH$_3$—SiH$_2$—O—SiH$_2$—)$_2$—CH$_2$ |
| 2,2-bis(1-methyldisiloxanyl)propane | (CH$_3$—SiH$_2$—O—SiH$_2$—)$_2$—C(CH$_3$)$_2$ |
| hexamethoxydisilane (HMDOS), | (CH$_3$O)$_3$—O—Si—Si—(OCH$_3$)$_3$ |
| dimethyldimethoxysilane (DMDMOS), and | (CH$_3$O)$_2$—Si—(CH$_3$)$_2$ |
| dimethoxymethylvinylsilane (DMMVS) | (CH$_3$O)$_2$—Si—(CH$_3$)—CH$_2$=CH$_3$. |
| 1,3,5 trimethyl 1,3,5 trivinylcyclotrisiloxane | |
| diethoxymethyloxiranylsilane | |

It is obvious that an oxidizing gas and/or a compound containing oxygen is used if the second layer contains oxygen, for example when it is a $SiO_2$ layer. If a layer of SICNH is to be prepared, an oxidizing gas or a precursor containing oxygen will not be used.

The deposition by PECVD is preferably performed under low-temperature conditions as already specified above.

For example, it is possible to use TEOS in the presence of oxygen, at low temperature, for example 200° C., or trimethylsilane and ammonia in the presence of helium.

Such conditions hardly or do not cause the first layer, for example of SiCH to decompose, degrade.

The crust can also be produced by a plasma treatment of the surface of the first layer deposited, which plasma may include, in a non-exhaustive manner, $O_2$, $H_2$, $N_2$, $NH_3$, $N_2O$, $CO_2$, $CH_4$, He, Ar, and so on, or a combination of these gases. However, it should be noted that, in this case, the control of the depth and the homogeneity of the crust is more difficult to achieve.

In a third step of the process of the invention, the assembly, the stack of the first layer and the second layer is treated under conditions so that a gas is generated in the first layer, preferably dielectric, in other words, under conditions enabling the foaming of the first layer. These conditions are in particular conditions ensuring the production of a gas from organic groups present in the first layer.

This treatment is generally a heat treatment, optionally combined with a plasma treatment, or a UV radiation treatment, or an electron beam treatment. The heat treatment is generally performed at a temperature of 250 to 500° C., for example at 400° C. The plasma can be, for example, a $H_2$ or $N_2$ plasma, and so on.

The duration of the treatment, which is generally from one to several minutes, for example, from 1 or 2 to 10 minutes, can be adjusted so as to vary the porosity ratio in the layer.

Optionally, in a fourth step, the second layer or "crust" layer can be removed. Indeed, according to the intended application, it will sometimes be necessary to remove the crust so as to have access directly to the porous dielectric layer. The removal of the crust can then be achieved, for example, by a plasma etching process using, for example, a fluorinated gas, a chemical etching process or chemical mechanical polishing (CMP). In every case, the fact that the crust has a composition which is homogeneous over the thickness and has a determined thickness makes it possible to better control the process of removing the crust. Nevertheless, it involves using a process compatible with the porous dielectric so as to prevent the decomposition, degradation, thereof.

The invention also relates to a thin layer of a nanoporous dielectric material with a homogeneous porosity obtainable by the process as described above.

The thin layers according to the invention, owing to their preparation process, intrinsically have a high nanoporosity ratio, which is generally associated with a low k value as defined above.

The porosity is homogeneous, distributed throughout the layer, and the average size of the pores is generally 0.5 to 4 nm.

The invention also relates to the use of said thin layer, in particular as an insulation dielectric in metal interconnections, and porous membranes in order to produce cavities used, for example, in "air-gap" interconnections, namely "air-gap" structures present in the interconnections.

The invention will now be described in reference to the following examples provided for illustrative and non-limiting purposes.

Example 1

A 100-nm thin layer of SiCH is deposited by PECVD at a low temperature of 60° C., from diphenylmethylsilane and helium.

Then, a layer of silicon oxide with a thickness of 50 nm is deposited on the thin layer under conditions that do not (or hardly) cause the SiCH to decompose, degrade, namely a deposition at 200° C., using TEOS in the presence of oxygen.

The stack of the two layers is then subjected to a heat treatment at 400° C. combined with a hydrogen plasma, which enables the foaming of the SiCH layer. The $SiO_2$ crust is then removed by chemical etching in a low-concentration hydrofluoric (HF) acid bath.

This type of layer (SiCH and even SiCNH) can then be used as a dielectric membrane permeable to HF in order to produce air gap-type interconnections or to produce cavities for MEMS and NEMS.

Example 2

A 100-nm thin layer of SiCH is deposited by PECVD at low temperature (80° C.), from trimethylsilane, toluene and helium.

The deposition can be performed in a planar capacitive reactor (for example a 300-mm AMAT "producer") with the following parameters: inter-electrode space between 300 and 500 mils, radiofrequency excitation at 13.56 MHz, power between 100 and 600 W, temperature between 100 and 300° C., and pressure between 4 and 10 Torrs.

The flow rates of each precursor are between 50 and 1000 cm$^3$/minute and the ratio between them is between 10:1 and 1:10.

Then, a layer of silicon oxide with a thickness of 10 to 50 nm is deposited on the thin layer under conditions that do not (or hardly) cause the SiCH to decompose, namely a deposition at 200° C., using TEOS in the presence of oxygen.

The stack of the two layers is then subjected to a heat treatment at 400° C., assisted by UV radiation, which enables the foaming of the SiCH layer.

The treatment time (from one to several minutes, for example from 1 or 2 to 10 minutes) can be adjusted to vary the porosity ratio in the layer.

The $SiO_2$ crust is then optionally removed by plasma etching using a fluorinated gas.

REFERENCES

[1] C. Xu et al., "Ultra low dielectric materials based on hybrid system of linear silicon precursor and organic porogen by plasma-enhanced chemical vapor deposition (PECVD)", US-A1-20040156987, May 27, 2004.
[2] K. Giles, "Low dielectric constant layers", U.S. Pat. No. 6,963,137, Nov. 8, 2005.
[3] L. L. Chapelon et al., "Characterization and integration of a CVD porous SiOCH (k<2.5) with enhanced mechanical properties for 65 nm CMOS interconnects and below", Microelec. Eng. 76 (2004) 1.
[4] S. Merlet et al., "Preparation and characterization of nanocellular poly(phenylquinoxaline) foams. A new approach to nanoporous high performance polymers", Macromolecules, 40 (2007) 2070.
[5] H. Yokoyama et al., "Nanocellular structures in block copolymers with $CO_2$-philic blocks using $CO_2$ as a blowing agent: crossover from micro- to nanocellular structures with depressurization temperature", Macromolecules, 38 (2005) 10516.
[6] WO-A-03/044843
[7] US-A1-2003/124870
[8] WO-A-2006/079979

The invention claimed is:

1. Process for preparing a thin layer of a nanoporous dielectric material with homogeneous porosity in which the following successive of steps are performed:
a first thin layer of a first oxygen-free material, including Si, C, and optionally one or more other atom(s) selected from the group consisting of H, N and F, is deposited on a substrate, under conditions so that said first thin layer has a composition making it possible to generate a gas in a subsequent foaming treatment;
on the first layer, a second thin layer of a second material including Si and at least one other atom selected from the group consisting of O, C, N, F and H is deposited under conditions so that said second thin layer has a composition that does not make it possible to generate a gas in the subsequent foaming step, and a sufficient density to limit or prevent the spread and/or diffusion of the gas generated in the first layer during the subsequent foaming treatment;
the first layer and second layer assembly is treated under conditions so that a gas is generated in the first layer in order to enable the foaming thereof and the creation of nanopores therein, resulting in homogeneous porosity throughout the first layer;
the second thin layer is optionally removed.

2. The process of claim 1, wherein the first and the second thin layers have a thickness of 5 to 1500 nm.

3. The process of claim 1, wherein the nanopores have a dimension defined by their average diameter, smaller than 10 nm.

4. The process of claim 1, wherein the material of the first layer is selected from the group consisting of SiCH, SiCN, SiCNH, SiCF and biphasic materials having a phase containing Si, C, H and a porogenic organic phase containing C and H.

5. The process of claim 1, wherein the deposition of the first layer is performed at a temperature of 20 to 250° C.

6. The process of claim 1, wherein the deposition of the first layer is performed by a process selected from the group consisting of the chemical vapor deposition process, the plasma-assisted or plasma-enhanced chemical vapor deposition processes, and the spin coating process.

7. The process of claim 6, wherein the deposition of the first layer is performed by a chemical vapor deposition process, or a plasma-assisted or plasma-enhanced chemical vapor deposition process, which uses one or more precursors chosen from oxygen-free organosilicon compounds, oxygen-free hydrocarbon compounds, ammonia, or mixtures thereof.

8. The process of claim 7, wherein the deposition of the first layer is performed in the presence of one or more inert gases.

9. The process of claim 1, wherein the first layer is deposited from trimethylsilane, toluene and helium, or from triphenylmethylsilane and helium.

10. The process of claim 1, wherein the second layer is a $SiO_2$ or SiCNH layer.

11. The process of claim 1, wherein the second layer is deposited by a chemical vapor deposition process or a plasma-assisted chemical vapor deposition process from one or more precursors, optionally one or more oxidizing gases and optionally one or more inert gases.

12. The process of claim 1, wherein the second layer is produced by a plasma treatment on a surface of the first deposited layer.

13. The process of claim 1, wherein the treatment of the first layer and second layer assembly is a heat treatment optionally combined with a plasma treatment, a UV radiation treatment or an electron beam treatment.

14. The process of claim 13, wherein the heat treatment is performed at a temperature of 250 to 500° C.

15. The process of claim 1, wherein the second thin layer is removed by a process selected from the group consisting of a plasma etching process, a chemical etching process, and a chemical mechanical polishing process.

* * * * *